United States Patent [19]

Matsuura et al.

[11] Patent Number: 5,420,070
[45] Date of Patent: May 30, 1995

[54] MANUFACTURING METHOD OF INTERCONNECTION STRUCTURE OF SEMICONDUCTOR DEVICE

[75] Inventors: Megumi Matsuura; Tomohiro Ishida, both of Hyogo, Japan

[73] Assignee: Mitsubishi Denki Kabushiki Kaisha, Tokyo, Japan

[21] Appl. No.: 192,910

[22] Filed: Feb. 7, 1994

Related U.S. Application Data

[62] Division of Ser. No. 959,904, Oct. 13, 1992, Pat. No. 5,306,952.

[30] Foreign Application Priority Data

Oct. 14, 1991 [JP] Japan .................................. 3-264636

[51] Int. Cl.$^6$ ........................ H01L 21/28; H01L 23/48
[52] U.S. Cl. ..................................... 437/190; 437/192; 437/194; 437/195; 437/200
[58] Field of Search ............... 437/190, 192, 195, 200, 437/194

[56] References Cited

U.S. PATENT DOCUMENTS

| | | | |
|---|---|---|---|
| 4,884,123 | 11/1989 | Dixit et al. ............................ | 437/190 |
| 4,926,237 | 5/1990 | Sun et al. . | |
| 4,933,743 | 6/1990 | Thomas et al. . | |
| 4,983,250 | 1/1991 | Pan ...................................... | 156/628 |
| 4,994,410 | 2/1991 | Sun et al. ............................. | 437/192 |
| 5,106,781 | 4/1992 | DeVries ............................... | 437/192 |
| 5,202,579 | 4/1993 | Fujii et al. . | |

FOREIGN PATENT DOCUMENTS

57-208161 12/1982 Japan .

OTHER PUBLICATIONS

Tomioka et al, "A New Reliability Problem Associated with Ar Ion Sputtering Cleaning of Interconnect Vias", 1989 IEEE/IRPS, pp. 53–58.

Nishida et al, "Multilevel Interconnection For Half-Micron ULSI's", 1989 IEEE VMIC Conference, pp. 19–25.

Abe et al, "High Performance Multilevel Interconnection System with Stacked Interlayer Dielectrics by Plasma CVD and BIAS Sputtering", 1989 IEEE VMIC Conference, pp. 404–410.

Gorowitz et al. publication entitled "Recent Trends in LPCVD and PECVD, Solid State Technology", Oct. 1987, pp. 97–103.

Bollinger, C., et al., "An Advanced Four Level . . . ", Jun. 12–13, 1990 VMIC Conference, pp. 21–27.

Dalton, C., "Enhanced Selective Tungsten . . ", Jun. 12–13, 1990 VMIC Conference, pp. 289–295.

*Primary Examiner*—T. N. Quach
*Attorney, Agent, or Firm*—Lowe, Price, LeBlanc & Becker

[57] ABSTRACT

In a multi-layer aluminum interconnection structure, improved reliability as well as a stable via-hole resistance are achieved by promoting mixing at an interface between aluminum interconnection layers and improving coverage of an upper aluminum interconnection layer at a connection hole. A first aluminum interconnection layer is electrically connected to a second aluminum interconnection layer through a connection hole. The second aluminum interconnection layer is provided with a titanium film, a titanium nitride film and aluminum alloy film. A connection hole is filled with a tungsten film. A tungsten film is formed on a surface of the first aluminum interconnection layer. The titanium film is in contact with the tungsten film through the connection hole.

6 Claims, 17 Drawing Sheets

MANUFACTURING METHOD OF INTERCONNECTION STRUCTURE OF SEMICONDUCTOR DEVICE

This application is a division of application Ser. No. 07/959,904 filed Oct. 13, 1992, now U.S. Pat. No. 5,306,952.

BACKGROUND OF THE INVENTION

1. Field of the Invention

The present invention relates generally to interconnection structures of semiconductor integrated circuit devices and a manufacturing method thereof and, more particularly, to an interconnection structure of a semiconductor integrated circuit device in which multilayer aluminum interconnection layers are mutually connected through a connection hole, and to a manufacture method thereof.

2. Description of the Background Art

In general, a semiconductor device comprises a semiconductor substrate and elements such as transistors formed thereon. Various interconnection layers are formed on the semiconductor substrate for electrically connecting these elements to each other and to an external circuit. These interconnection layers have been formed of polysilicon films, refractory metal films, refractory metal silicide films, aluminum-films and aluminum alloy films. In recent years, reduction of the interconnection layer resistance has been required in the semiconductor integrated circuit devices which are highly integrated for high speed operations. Therefore, the semiconductor integrated circuit devices essentially require aluminum multilayer interconnection structure formed of aluminum films or aluminum alloy films having a small specific resistance. An example of the conventional aluminum multilayer interconnection structure is disclosed in "High Performance Multilevel Interconnection System with Stacked Interlayer Dielectrics by Plasma CVD and Bias Sputtering", M. Abe et al. pp. 404–410, VMIC Conference, Jun. 12–13, 1989.

FIG. 17 is a partial sectional view showing an example of an aluminum multilayer interconnection structure in the conventional semiconductor integrated circuit device. In the figure, a silicon semiconductor substrate 1 bears DRAM (Dynamic Random Access Memory) cells 2 which are formed in a stacked cell structure. A base insulating film 3 is formed on DRAM cells 2. First aluminum interconnection layers 4 are formed on the base insulating film 3 with predetermined spaces between each other. The first aluminum interconnections 4 are covered with an interlayer insulating film 5, which is provided with connection holes 6 (also called a "via-hole" or "through-hole"). Second aluminum interconnection layers 7 are formed on the interlayer insulating film 5 and are connected to the first aluminum interconnection layers 4 through the connection holes 6. A protection insulating film 8 is formed to cover DRAM cells 2, first aluminum interconnection layers 4 and second aluminum interconnection layers 7 to protect them against moisture and other external material.

In the conventional aluminum multilayer interconnection structure shown in FIG. 17, yield and reliability of the semiconductor device technically depends on stability of a connection part (hereinafter called "via-hole portion") between the first aluminum interconnection layer and the second aluminum interconnection layer. A manufacturing method of the conventional aluminum multilayer interconnection structure shown in FIG. 17 will be described particularly with respect to formation of the via-hole part. The multilayer interconnection structure has been generally formed of a combination of polysilicon interconnections, refractory metal interconnections, refractory metal silicide interconnection layers and aluminum interconnections. However, a description will be made hereinafter of an aluminum two-layer structure in which both interconnection layers in the first and the second layers are aluminum interconnection layers.

FIGS. 18 through 24 are partial sectional views showing a manufacturing method of the aluminum two-layer interconnection structure in the conventional semiconductor integrated circuit device in the order of the manufacturing steps.

Referring to FIG. 18, DRAM cell 2 is formed on the surface of silicon semiconductor substrate 1. DRAM cell 2 is formed of an element separator oxide film 301, a transfer gate electrode 302, an impurity diffusion layer 303, a word line 304, a memory node 305, a capacitor insulating film 306, a cell plate 307 and an insulating film 309.

Referring to FIG. 19, base insulating film 3 is formed on the whole surface of silicon semiconductor substrate 1 in which DRAM cell 2 is formed. Then, photolithography and etching technique are used for forming a contact hole 308 at a predetermined position in the base insulating film. First aluminum interconnection layer 4 is formed as a bit line and electrically contacts with the impurity diffusion layer 303 through this contact hole 308. Recently, a semiconductor integrated circuit device in which sizes of elements are reduced to an order of submicron has employed the interconnection layer as first aluminum interconnection-layer 4, in which a barrier metal film 310 such as titanium nitride (TIN) or titanium-tungsten (TiW) and an aluminum alloy film 311 of Al-Si-Cu or the like are combined. The aluminum interconnection layer having such structure has been used for the following reasons.

(i) If the aluminum is in direct contact with the silicon substrate (impurity diffusion layer) at the contact portion, an abnormal reaction (alloy spike) is locally caused. This produces a reaction layer which breaks through a region of the impurity diffusion layer and extends downwardly in the silicon substrate resulting in a junction leak in the impurity diffusion layer. In order to prevent this, the barrier metal film is formed in direct contact with the silicon substrate (impurity diffusion layer).

(ii) Silicon in the aluminum alloy film is deposited at the contact portion due to the solid-phase epitaxial growth which causes imperfect contact. In order to prevent this, the barrier metal film is formed under the aluminum alloy film.

(iii) An interlayer insulating film and protection insulating film are formed on the aluminum interconnection layer. A film stress by these upper insulating films may break the aluminum interconnection layers. In order to increase the resistance against such stress migration phenomenon, the barrier metal film is formed under the aluminum alloy film.

A film forming first aluminum interconnection layer 4 is usually formed by deposition in a sputtering method and subsequent patterning thereof using the photolithography and etching technology.

Referring to FIG. 20, interlayer insulating film 5 is formed on the whole surface of the first aluminum interconnection layer 4. Interlayer insulating film 5 is formed of a combination of a silicon oxide film 321 formed by, for example, the CVD (Chemical Vapor Deposition), an inorganic application insulating film 322 and a silicon oxide film 323 formed by the CVD.

Silicon oxide film 321 is formed by the CVD utilizing heat and plasma at formation temperatures of 300°–450° C., using a mixture of a silane ($SiH_4$) gas and an oxygen-($O_2$) gas or a nitrous oxide ($N_2O$) gas. Recently, a silicon oxide film has been formed from an organic silane contained material such as TEOS (Tetra-Ethyl-Ortho-Silicate) characterized by a good step coverage.

Inorganic application insulating film 322 formed for flattening generally includes silanol (Si $(OH)_4$) or the like as the main component. After rotary application of material including silanol or the like as the main component, baking is carried out at temperatures of 400°–450° C. for changing the material to a silicon oxide film, whereby the surface of the silicon oxide film 321 formed by the CVD is flattened. Since inorganic application insulating film 322 has a high hygroscopic property, it may cause a disadvantage such as gas emission if the insulator film 322 is exposed at a sidewall of the via-hole portion. Therefore, inorganic application insulating film 322 is subjected to an etch back processing by dry etching using a fluorine contained gas or an argon gas so that the surface of inorganic application insulating film 322 is not exposed at the sidewall of the via-hole portion.

A silicon oxide film 323 is formed on the inorganic application insulating film 322 in the manner similar to that for forming silicon oxide film 321.

Referring to FIG. 21, connection hole 6 is formed by photolithography and etching to expose a predetermined surface of the first aluminum interconnection layer 4. The step is carried out as follows.

A photoresist 324 is provided to cover a region except for where connection hole 6 is formed by photolithography. Then, interlayer insulating film 5 is selectively removed to open connection hole 6.

Photoresist 324 as well as a reaction product and the like produced in the etching are removed by an oxygen ($O_2$) plasma and a wet chemical processing after the etching.

Referring to FIG. 22, in the step for forming connection hole 6, the surface of the first aluminum interconnection layer 4 is exposed to plasma of a fluorine contained gas such as $CHF_3$ or an oxygen gas, so that a deterioration layer 201 (a layer including fluoride and oxide) of aluminum is formed in a thickness of about 100 Å on the surface of first aluminum interconnection layer 4 in connection hole 6. Therefore, in order to remove an insulating film of the thin deterioration layer of aluminum so as to obtain a stable contact resistance, sputter etching using argon ions ($Ar^+$) 202 is carried out prior to the formation of the second aluminum interconnection layer.

Then, as shown in FIG. 23, the second aluminum interconnection layer 7 is continuously deposited in a vacuum using the sputter method. For second aluminum interconnection layer 7, a film of aluminum alloy such as Al-Si, Al-Si-Cu, or Al-Cu is used. These films are formed by the patterning using the photolithography and etching in the manner similar to that of the first aluminum interconnection layer.

After second aluminum interconnection layer 7 is formed, heat treatment is carried out at temperatures of about 400°–450° C. so that first and second aluminum interconnection layers 4 and 7 contact with each other in connection hole 6.

Finally, as shown in FIG. 24, protection insulating film 8 such as a silicon oxide film or a silicon nitride film is deposited on second aluminum interconnection layer 7 by the CVD so as to protect semiconductor elements and interconnections against moisture or the like entering from the external.

The conventional aluminum multilayer interconnection structure has the following problems.

Due to the miniaturization of interconnections, a diameter of connection hole 6 has been reduced. If the diameter of connection hole 6 is at a sub-micron level, a problem may arise relating to stability and reliability in the electrical connection at connection hole 6. In the conventional case, as described above, the sputter etching is carried out using argon ions prior to the formation of second aluminum interconnection layer 7. In this etching as shown in FIG. 25 A, argon ions 202 remove a deterioration layer 201 (a layer including fluoride and oxide) formed on the surface of first aluminum interconnection layer 4 in connection hole 6. In the conventional structure in which connection hole 6 has a relatively small aspect ratio (B/A) [A: a diameter of the connection hole, B: a film thickness (about 1 $\mu$m) of the interlayer insulating film] of not more than 1, particles 203 of oxide and fluoride of aluminum sputtered with argon ions 202 sufficiently scatter up to the outside of connection hole 6, as shown in FIG. 25A. Therefore, by removing deterioration layer 201 of aluminum, the surface of the first aluminum interconnection layer 4 in connection hole 6 can be cleaned.

However, if connection hole 6 having the diameter at the sub-micron level on the aspect ratio (B/A) over 1, as shown in FIG. 25B, the particles 203 of the oxide and fluoride of aluminum sputtered by argon ions 202 is partially blocked by the sidewall of connection hole 6, and thus can not scatter to the side of connection hole 6. Therefore, some of the particles 204 re-stick onto the inside of connection hole 6. This phenomenon is reported in "A New Reliability Problem Associated with Ar Ion Sputter Cleaning of Interconnect Vias", H. Tomioka et al., IEEE/IRPS, 1989, pp. 53–58.

As a result, even if the continuous deposition of second aluminum interconnection layer 7 in a vacuum is carried out as a next step, the particles 204 of the oxide and fluoride of aluminum, which have stuck onto an interface 205 between first and second aluminum interconnection layers 4 and 7 in connection hole 6 during the sputtering etching, remain there, as shown in FIG. 26A. Thereby, in the heat treatment at about 400°–450° C. after the formation of the second aluminum interconnection layer, mixing can not be sufficiently carried out at the interface 205 between the first and second aluminum interconnection layers.

Consequently, a contact resistance (called "via-hole resistance") in connection hole 6 may be increased and-/or an open failure (a failure in conduction between the first and second aluminum interconnection layers) may be caused.

Further, even if the initial via-hole resistance has a correct value owing to a heat treatment at 400°–450° C. described above, the mixing has not been sufficiently carried out at interface 205 between the first and second aluminum interconnection layers. Therefore, the reliability in connection hole 6 such as resistance against the electro-migration and stress-migration is reduced.

For an approach to alleviate such problems, as shown in FIG. 26B, a first aluminum interconnection layer 4 has been recently used in which a film of refractory metal such as tungsten (W) and titanium-tungsten (Ti-W), a film of refractory metal compound such as titanium nitride (TIN), a film of refractory metal silicide such as molybdenum-silicide (MoSi$_2$) and tungsten-silicide (WSi$_2$), or a film containing refractory elements such as an amorphous-silicon film are provided on a surface of an aluminum alloy film 311 of a first layer. In such structures, it is known that refractory element-containing film 312 produces thinner deterioration layer in the step of the formation of the through-hole compared to aluminum alloy film 311.

However, even when the above described structure is adopted, the re-sticking phenomenon in the connection hole at a sub-micron level in sputter-etching is not completely prevented. Since a thinner deterioration layer is produced on the surface of a refractory element-containing film 312 which is the uppermost layer of first aluminum interconnection layer 4, a small amount of sputter-etching is sufficient, and therefore the re-sticking is reduced to some degree.

Therefore, when second aluminum interconnection layer 7 is formed on the refractory element-containing film particles 314 of the fluoride and oxide of tungsten which re-stuck at the time of sputter-etching exist on an interface 205 of first aluminum interconnection layer 4 and second aluminum interconnection layer 7, as shown in FIG. 26C. This prevents mixing in interface 205 of the first aluminum interconnection layer and the second aluminum interconnection layer. Consequently, via-hole resistance in connection hole 6 is increased and/or an open failure is caused. As a result a problem arises that reliability in the connecting hole is reduced.

Another problem resulting from an increase in the aspect ratio of connection hole 6 is that coverage ratio in the connection hole of second aluminum interconnection layer 7 by the sputter method significantly decreases. When the coverage ratio of aluminum in the connection hole is low, not only reliability in connection hole 6 such as resistance against electro-migration is reduced but also a via-hole resistance increases.

This problem will be more serious for the connecting hole in a future semiconductor integrated circuit device with a larger aspect ratio (B/A) miniaturized in an order of sub-micron or an order of half-micron.

SUMMARY OF THE INVENTION

An object of the present invention is to facilitate mixing in the interface of the connection portion between a lower aluminum interconnection layer and an upper aluminum interconnection layer.

Another object of the present invention is to improve coverage in a connection hole of an upper aluminum interconnection layer.

A further object of the present invention is to stabilize the via-hole resistance in the connection between a lower aluminum interconnection layer and an upper aluminum interconnection layer.

Still another object of the present invention is to improve the reliability level of resistance against electro-migration and stress-migration in a via-hole portion.

A still further object of the present invention is to provide an interconnection structure for a semiconductor integrated circuit device of high quality and high yield.

Yet a further object of the present invention is to manufacture an interconnection structure for facilitating mixing in the connection interface of a lower aluminum interconnection layer and an upper aluminum interconnection layer.

Yet another object of the present invention is to manufacture an interconnection structure having coverage improved in a connection hole of an upper aluminum interconnection layer.

Yet a still further object of the present invention is to manufacture an interconnection structure for stabilizing via-hole resistance in the connection between a lower aluminum interconnection layer and an upper aluminum interconnection layer.

An additional object of the present invention is to manufacture an interconnection structure improved in the reliability of resistance against electro-migration and stress-migration in a via-hole portion.

Another object of the present invention is to manufacture an interconnection structure of a semiconductor integrated circuit device of high quality and high yield.

An interconnection structure for a semiconductor device according to the invention includes a first aluminum interconnection layer, an insulating layer, a second aluminum interconnection layer, and a metal contained layer. The first aluminum interconnection layer includes a refractory element-containing layer having a melting point higher than that of aluminum on its surface. The insulating layer is provided with a through-hole formed on the first aluminum interconnection layer and reaching the surface of the first aluminum interconnection layer. The second aluminum interconnection layer is formed on the insulating layer and electrically connected to the first aluminum interconnection layer through the through-hole. The second aluminum interconnection layer includes a titanium layer, a titanium compound layer, and an aluminum-containing layer. The titanium layer is formed on the insulating layer to extend through the through-hole. The titanium compound layer is formed on the titanium layer. The aluminum-containing layer is formed on the titanium compound-layer. The metal-containing layer is formed under the aluminum-containing layer and on the titanium compound layer and fills the through-hole.

According to a manufacturing method of an interconnection structure of a semiconductor device according to another aspect of the present invention, first, a first aluminum-containing layer is formed on a main surface of a semiconductor substrate. On the first aluminum-containing layer, a refractory element-containing layer having a melting point higher than that of aluminum is formed. The insulating layer is formed on the refractory element-containing layer. By selectively removing the insulating layer, a through-hole is formed to expose a surface of the refractory element-containing layer. A titanium layer is formed on the insulating layer to be in contact with the surface of the refractory element containing layer through the through-hole. A titanium compound layer is formed on the titanium layer. A metal-containing layer is selectively formed to fill the through-hole on the titanium compound layer. The second aluminum-containing layer is formed on the metal-containing layer and the titanium compound layer.

In the interconnection structure of the present invention, as a base film of the upper second aluminum interconnection layer in contact with the lower first aluminum interconnection layer in a portion of the through-hole, a stacked-layer structure comprised of a titanium layer and titanium compound layer is adapted. A surface of the lower first aluminum interconnection layer contacts with the titanium layer. The surface of the lower first aluminum interconnection layer includes the refractory element containing layer having a melting point higher than that of aluminum, and thus the lower refractory element-containing layer is in contact with the upper titanium layer. Since this titanium layer has a strong binding power with fluoride and oxygen, it serves as described below, even if particles of oxide and fluoride of refractory metal and the like remain on the surface of the lower refractory element-containing layer, which includes refractory metal and the like in a portion of the connection hole because of re-sticking during the sputter-etching.

(i) The titanium layer captures the particles of the oxide and fluoride of aluminum as the oxide and fluoride of titanium, and decomposes them.

(ii) The titanium layer improves adhesion to the refractory element-containing layer existing on the surface of the lower first aluminum interconnection layer.

The titanium compound layer formed on the titanium layer prevents reaction of the titanium layer, which is in contact with the first aluminum interconnection layer, with the upper aluminum contained layer, and helps the titanium layer to react with the deterioration layer and the particles remaining on the refractory element-containing layer.

That is, if the titanium compound layer were not formed, a layer for preventing the reaction of the titanium layer and the upper aluminum contained layer would not exist at the interface therebetween, and thus the titanium layer would easily react with the upper aluminum-containing layer at a relatively low temperature of about 200°–300° C. to form an intermetallic compound ($TiAl_3$) prior to the reaction with the deterioration layer and the particles remaining on the refractory element-containing layer in the surface of the first lower aluminum interconnection layer. In this case, the titanium layer would not sufficiently decompose the deteriorating layer and the particles remaining on the refractory element-containing layer in the surface of the lower first aluminum interconnection layer in the connection hole, and will not maintain sufficient adhesion by the reaction with the refractory element-containing layer in the surface of the lower first aluminum interconnection layer.

The structure of the invention, however, includes the provision of the titanium compound layer, which has less reactivity with the aluminum, on the titanium layer to suppress the reaction of the titanium layer and the upper aluminum-containing layer. Therefore, by the heat treatment at 300°–450° C. after the formation of the upper aluminum-containing layer, the deterioration layer and the particles remaining on the refractory element-containing layer in the surface of the lower aluminum interconnection layer in the connection hole, which are produced by re-sticking in the sputter-etching, are captured as the oxide and fluoride of titanium are decomposed. Further, the titanium layer reacts with the refractory element-containing layer in the surface of the lower first aluminum interconnection layer, and serves to improve adhesion at the interface between the refractory element-containing layer and the titanium layer itself.

The connection hole is filled with the metal contained layer on the titanium compound layer, so that the metal-containing layer improves coverage at the connection hole of the second aluminum interconnection layer.

Thus the electric contact resistance (via-hole resistance) is stabilized even at the connection hole having a diameter at the sub-micron level. Further, the reliability such as the resistance against the electron-migration and stress-migration at the via-hole portion is improved.

As described above, according to the present invention, by employing a stacked-layer film comprised of a titanium layer and a titanium compound layer as a base layer for the upper aluminum interconnection layer adjacent to the lower aluminum interconnection layer through a connection hole, a stable contact can be made at a connection hole of a multi-layer aluminum interconnection structure. And also, coverage of the upper aluminum interconnection layer in connection hole is improved by using a metal-containing layer filling the connection hole, so that an electrical contact resistance is stabilized and that the reliability of a semiconductor integrated circuit device is improved in the connection hole such as resistance against electro-migration and stress-migration.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A description of one embodiment of the present invention will be given hereinafter with reference to the figures.

Figure 1:
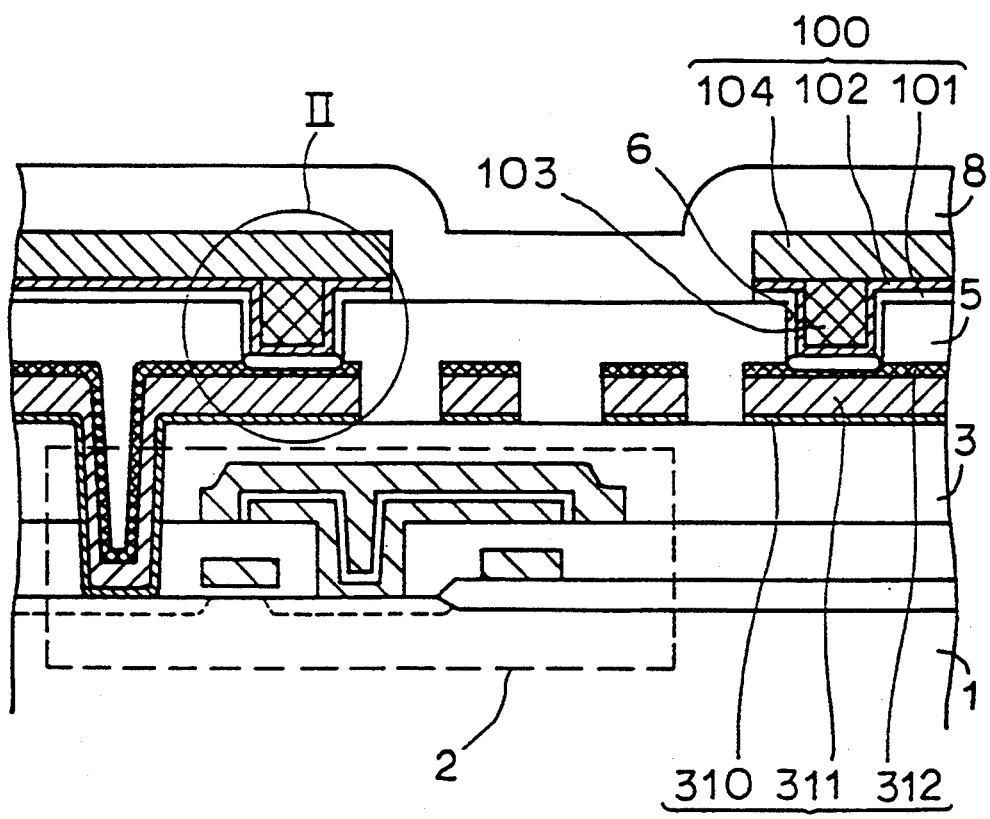
FIG. 1 is a partially sectional view showing an interconnection structure of a semiconductor integrated circuit device according to one-embodiment of the present invention.
Figure 2:
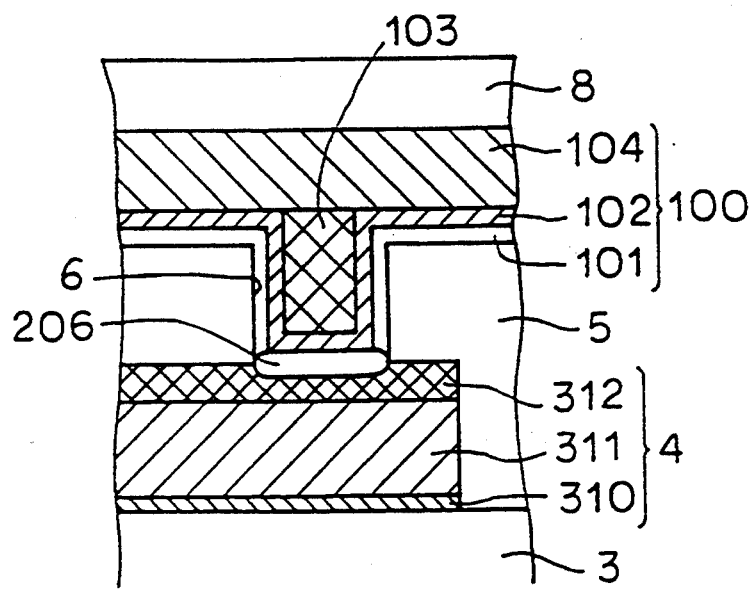
FIG. 2 is an enlarged partially sectional view showing a portion of II in FIG. 1.

FIG. 1 is a partial sectional view showing one example of an interconnection structure according to the present invention. FIG. 2 is an enlarged partial sectional view showing a portion II in FIG. 1. Referring to these figures, a DRAM cell 2 is formed on a silicon semiconductor substrate 1 to have a stacked-cell structure. On DRAM cell 2, a base insulating film 3 is formed. On base insulating film 3, first aluminum interconnection layers 4 which-are spaced apart from each other are formed. First aluminum interconnection layer 4 is formed of a titanium nitride film 310 as a barrier metal film, a film 311 of aluminum alloy such as Al-Si-Cu and a tungsten film 312. An interlayer insulating film 5 is formed to cover first aluminum interconnection layer 4. A connection hole 6 is opened to reach a surface of first aluminum interconnection layer 4 in interlayer insulating film 5. A second aluminum interconnection layer 100 is formed on interlayer insulating film 5 to electrically connect with first aluminum interconnection layer 4 through connection hole 6. Second aluminum interconnection layer 100 is comprised of a titanium film 101, titanium nitride film 102, and an aluminum film or aluminum alloy film 104. Titanium film 101 is formed as a base film of second aluminum interconnection layer 100 and is in contact with the surface of first aluminum interconnection layer 4. Titanium nitride film 102 is formed as a base film of second aluminum interconnection layer 100 on titanium film 101. The aluminum film or aluminum alloy film 104 is formed on titanium nitride film 102. Tungsten plug or tungsten compound plug 103 is formed on titanium nitride film 102 and fills connection hole 6. A protection insulating film 8 is formed on the whole surface to protect the interconnection structure from the external environment. As shown in FIG. 2, an alloy layer 206 is formed at an interface of titanium film 101 and tungsten film 312 in the surface of first aluminum interconnection layer 4 through the reaction of these films.

In the embodiment of the interconnection structure shown in FIG. 1, a formation method of, in particular, a connection portion (via-hole portion) of lower first aluminum interconnection layer 4 and upper second aluminum interconnection layer 100 will be described. FIGS. 3 through 13 are partial sectional views showing a formation method of the interconnection structure shown in FIG. 1 in the order of the steps.

Figure 3:
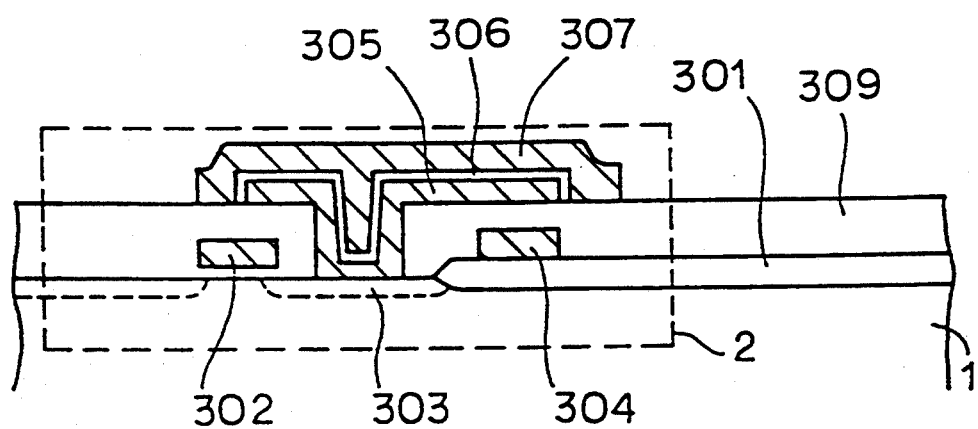
FIGS. 3 through 13 are partial sectional views showing respective steps of a formation method of the interconnection structure shown in FIG. 1.

Referring to FIG. 3, DRAM cell 2 is formed on the surface of silicon semiconductor substrate 1. DRAM cell 2 is comprised of an element separator oxide film 301, transfer gate electrode 302, an impurity diffusion layer 303, a word line 304, a memory node 305, a capacitor insulating film 306, a cell plate 307 and an insulating film 309.

Figure 4:
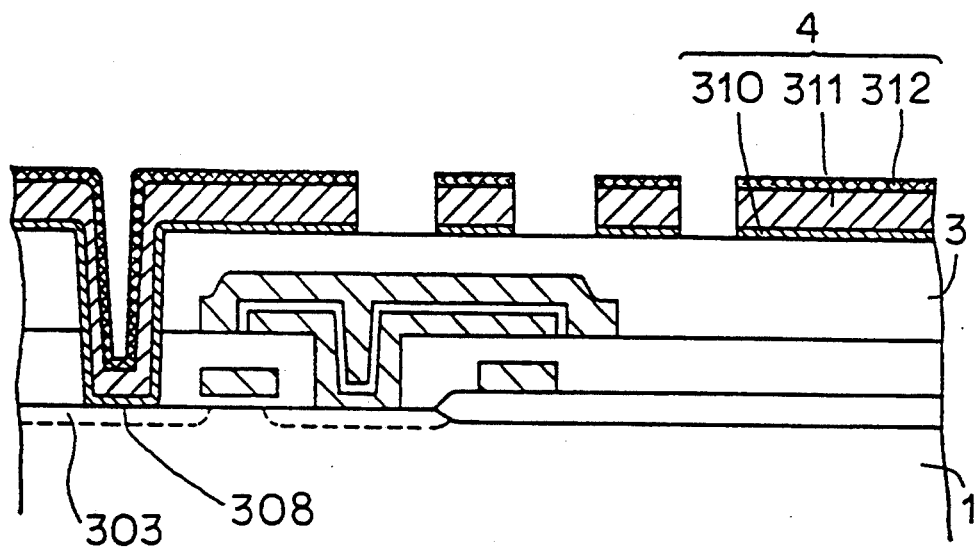

Referring to FIG. 4, base insulating film 3 is formed on the whole surface of silicon semiconductor substrate 1 in which DRAM cell 2 is formed. Thereafter, a contact hole 308 is opened in a predetermined portion of the base insulating film using photolithography and etching. First aluminum interconnection layer 4 is formed as a bit line to be in electrical contact with impurity diffusion layer 303 through contact hole 308.

Recently, in a semiconductor integrated circuit device in which the sizes of elements are miniaturized to an order of sub-micron, an interconnection layer in which a combination of a film 310 of barrier metal such as titanium nitride and titanium-tungsten (TiW) and a film 311 of aluminum alloy such as Al-Si-Cu and Al-Si thereon is used for first aluminum interconnection layer 4, that is, for a base film. The aluminum interconnection having such a structure is used for the following reasons.

(i) Prevention of junction leak by an abnormal reaction (alloy spike) of aluminum and a silicon substrate (an impurity diffusion layer) at a contact portion.

(ii) Prevention of imperfect contact caused by deposition of silicon included in the aluminum alloy film on the contact portion because of a solid-phase epitaxial growth.

(iii) Improvement of resistance against a so-called stress-migration phenomenon in which an aluminum interconnection breaks by film stress of the protection insulating film and/or the interlayer insulating film formed in the upper aluminum interconnection layer.

Tungsten film 312 is formed on aluminum alloy film 311 for the following purposes.

(a) A thickness of the deterioration layer produced in the forming step of the connection hole is decreased, so that the deterioration layer is easily removed by sputter-etching.

(b) Tungsten film 312 is employed as a reflection-preventing film in photolithography in the forming step of the connection hole.

(c) Reliability of the first aluminum interconnection layer such as resistance against electro-migration and stress-migration is improved.

A film forming first aluminum interconnection layer 4 is generally formed by successive deposition using a sputter method and subsequent patterning using photolithography and etching.

Figure 5:
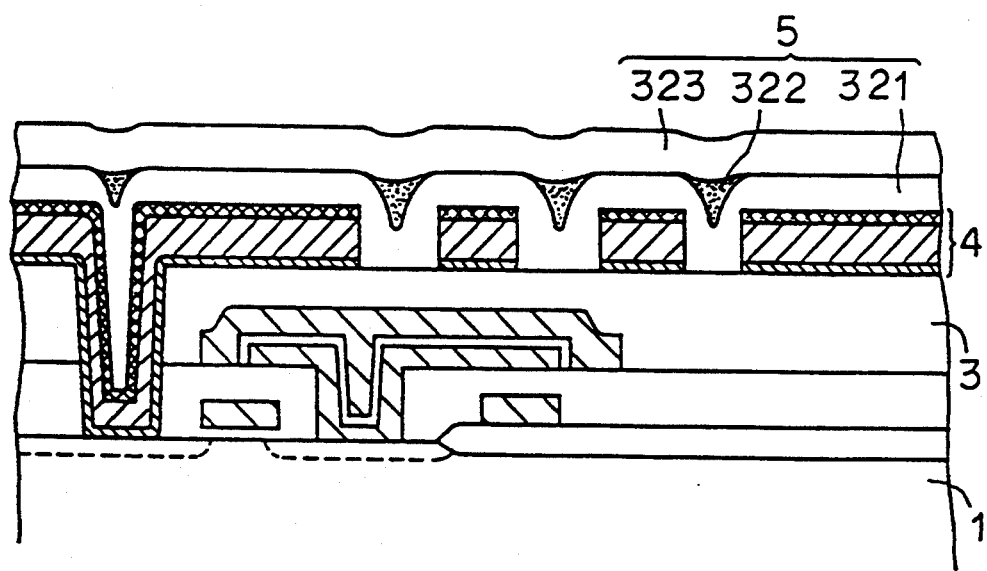

Referring to FIG. 5, interlayer insulating film 5 is formed on the whole surface of first aluminum interconnection layer 4. Interlayer insulating film 5 may be an insulating film of a combination of a silicon oxide film 321 formed by a Chemical Vapor Deposition method (CVD), inorganic application insulating film 322, and a silicon oxide film 323 formed by the CVD method.

Silicon oxide film 321 is generally formed by the CVD method utilizing heat and plasma at formation temperatures of 300°-450° C., using a mixture of a silane ($SiH_4$) gas, and an oxygen ($O_2$) gas or a nitrous oxide ($N_2O$) gas. A silicon oxide film has recently formed using organic silane contained material such as TEOS (Tetra-Ethyl-Ortho-Silicate) having a property of good step coverage.

Inorganic application insulating film 322 formed for planarization generally has silanol (Si $(OH)_4$) or the like as a main component. After rotary coating of material containing silanol or the like as a main component, baking is carried out at temperatures of 400°-450° C. to change it to a silicon oxide film, so that a surface of silicon oxide film 321 formed by the CVD method is made coplanar. Since inorganic application insulating film 322 has a high hygroscopic property, a disadvantage such as gas emission is caused if it is exposed at the sidewall of the via-hole portion. Inorganic application insulating film 322 is subjected to etch-back processing by a dry etching using a fluoride contained gas or an argon gas so as not to have its surface exposed at the sidewall of the via-hole portion.

Silicon oxide film 323 is formed on inorganic application insulating film 322 in the same manner as that for the formation of silicon oxide film 321.

Figure 6:
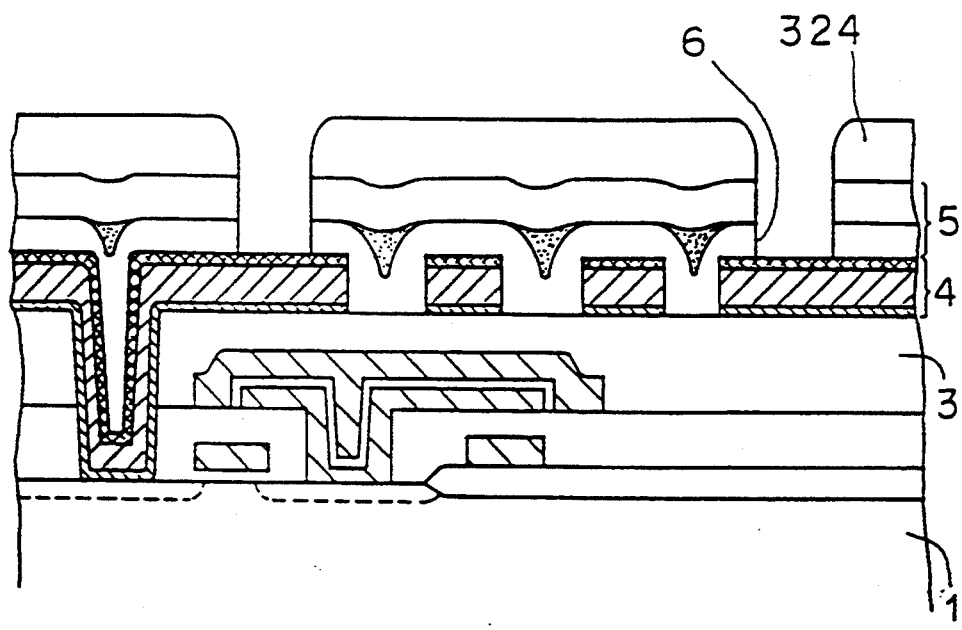

Referring to FIG. 6, connection hole 6 is opened using photolithography and etching, so that a predetermined surface of first aluminum interconnection layer 4 is exposed. This step is carried out as follows.

Photoresist 324 is provided in a region except where connection hole 6 is formed using photolithography. Thereafter, interlayer insulating film 5 is selectively removed by etching and connection hole 6 is opened.

Photoresist 324 and reactive products produced in the etching are removed using oxygen ($O_2$) plasma and/or a wet chemical processing method after the etching.

Figure 7:
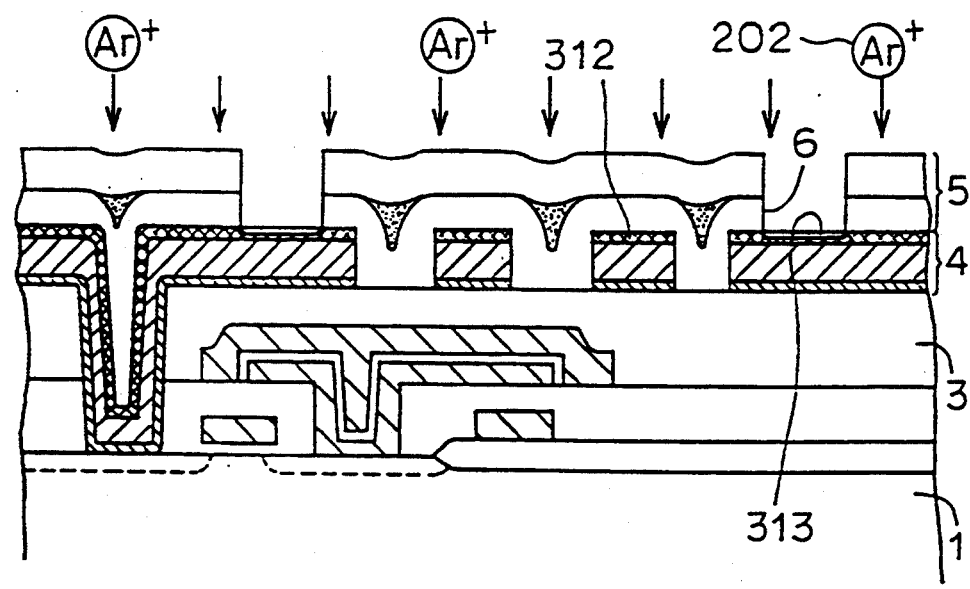

Referring to FIG. 7, a deterioration layer 313 of tungsten (a layer including fluoride and oxide) having a thickness of about 50–100 Å is formed on tungsten film 312 in the surface of first aluminum interconnection layer 4 at connection hole 6 through exposure by plasma of a fluoride contained gas such as $CHF_3$ and/or an oxygen gas in the forming step of connection hole 6. In order to remove the thin deterioration layer 313 and thus obtain a stable via-hole resistance, sputter-etching is carried out using argon ions 202.

Figure 8:
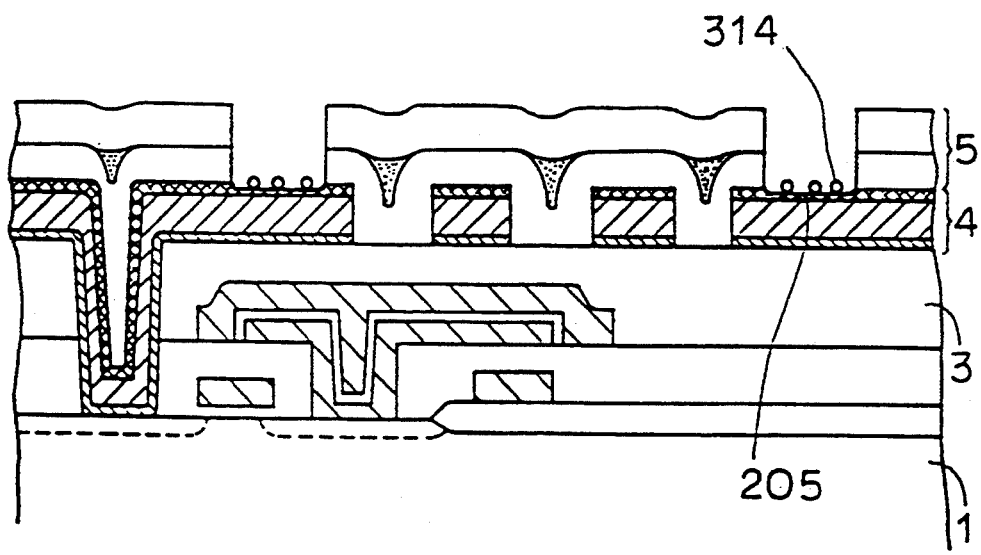
Figure 9:
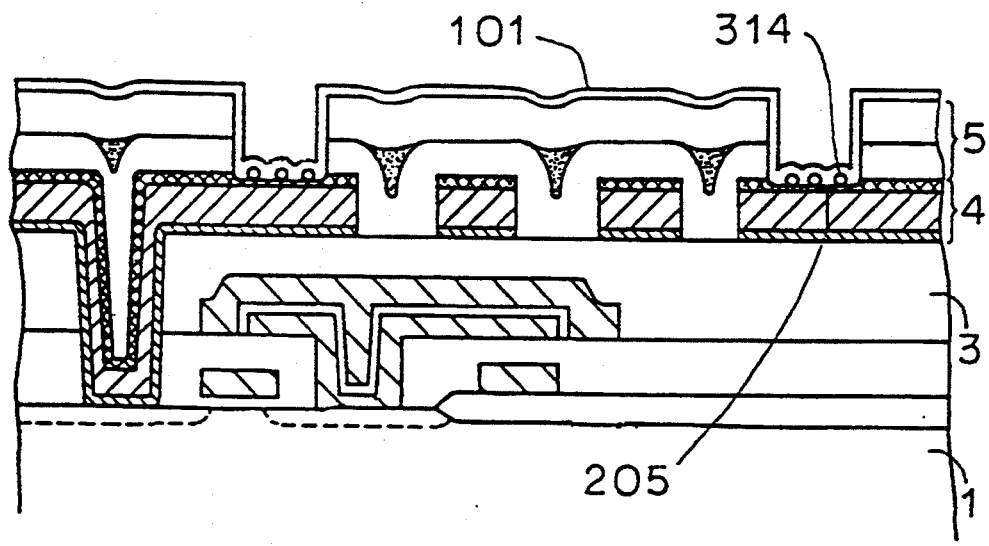

As shown in FIG. 8, when connection hole 6 at a submicron level has an aspect ratio (B/A) of more than 1, sputter-etching using argon ions 202 is not enough to prevent the re-sticking of the deterioration particles of fluoride and oxide and the like included in the tungsten sputtered by the argon ions, so that particles 314 of the fluoride and oxide included in the tungsten remain on a surface 205 of the first aluminum interconnection layer in connection hole As shown in FIG. 9, after deterioration layer 313 of tungsten is mostly removed by sputter-etching, a titanium film 101 is deposited on the whole surface successively in a vacuum in a thickness of about 50–150 Å using a sputter method in order to decompose a small amount of deterioration particles 314 of tungsten still existing.

Figure 10:
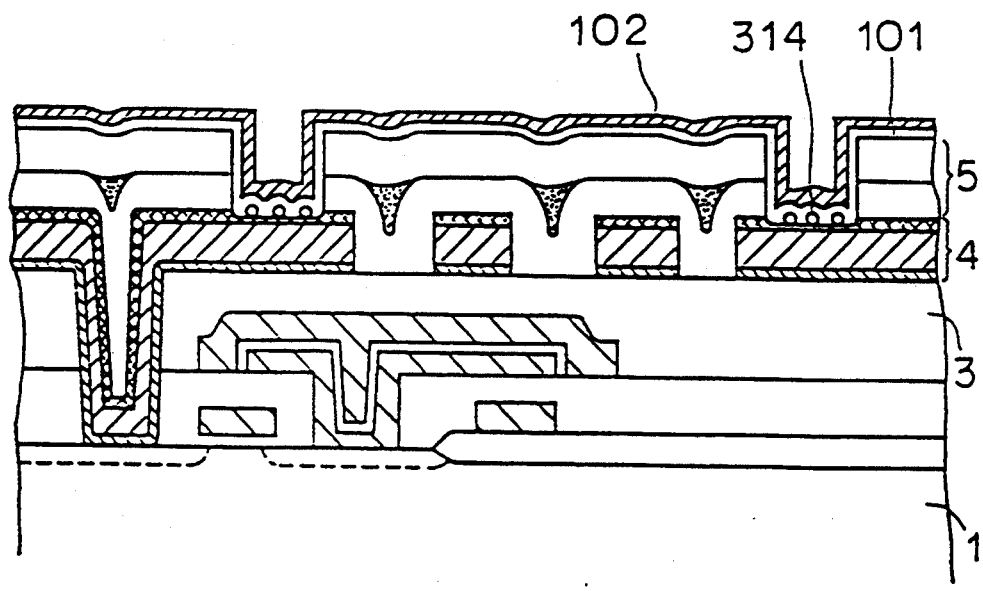

Referring to FIG. 10, a titanium nitride film 102 is deposited in a thickness of 500–1000 Å on titanium film 101. For the depositing method, a reactive sputter method is usually used in which sputtering is carried out in an atmosphere of AR+$N_2$ gas using Ti target. Titanium nitride film 102 serves to restrain titanium film 101 in contact with first aluminum interconnection layer 4 from reacting with the upper aluminum-containing film in the via-hole portion. Thus, the titanium nitride film whose resistivity is as small as about 250–400 $\mu\Omega\cdot cm$ is used so as to have a less reactivity with the upper aluminum-containing film and suppress an increase of a via-hole resistance as much as possible.

Since a titanium nitride film used as a barrier metal film in a contact portion with a silicon substrate needs a barrier property against silicon and aluminum, a film having a high resistivity of about 400–2000 $\mu\Omega\cdot cm$ is generally used. However, if such a titanium nitride film is used in a via-hole portion, a problem arises that a via-hole resistance increases several times compared to that in the conventional structure. Titanium nitride film 102 used in a via-hole portion is formed for the purpose of suppressing the reaction of titanium film 101 with the upper aluminum-containing film. Therefore, titanium nitride film 102 does not greatly require a barrier property against aluminum. And hence, a titanium nitride film having a small resistivity of about 250–400 $\mu\Omega\cdot cm$ can be employed. As a result, less than 50% increase of the via-hole resistance can be achieved, which does not cause any problem in practice.

Furthermore, the thickness of titanium nitride film 102 should be about 500–1000 Å for the reasons that titanium nitride film 102 restrains lower titanium film 101 from reacting with the upper aluminum-containing film and that an increase of the via-hole resistance should be in the range where no problem arises in practice.

Figure 11:
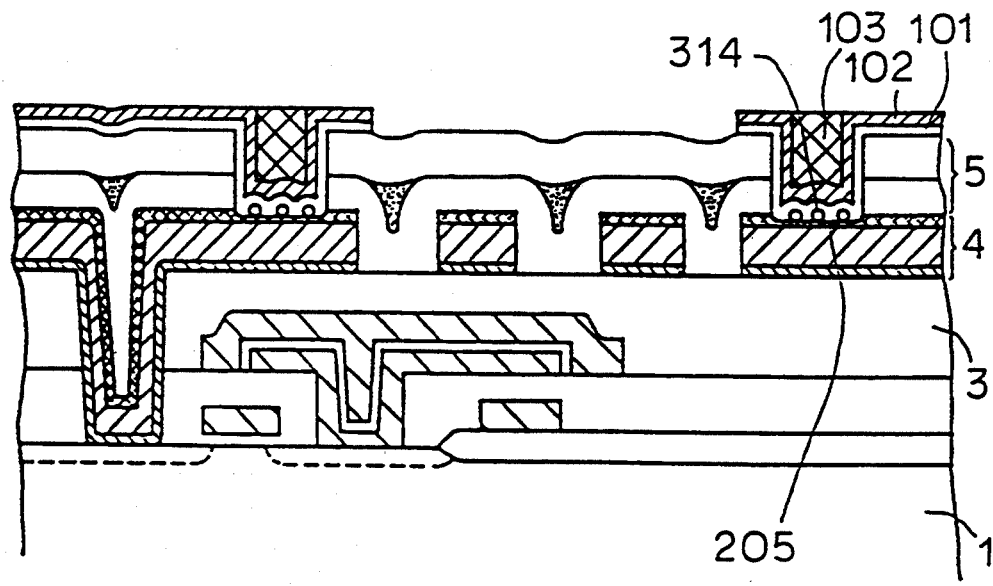

Thereafter, as shown in FIG. 11, in atmosphere at temperatures of 300°–500° C., a tungsten film is formed on the whole surface of silicon semiconductor substrate 1 by the CVD method. Two typical examples of a forming step of a tungsten film by the CVD method are represented using chemical formula hereinafter.

(i) A method of reducing $SiH_4$

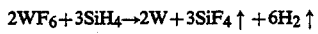

$$2WF_6 + 3SiH_4 \rightarrow 2W + 3SiF_4 \uparrow + 6H_2 \uparrow$$

(ii) A method of reducing $H_2$

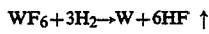

$$WF_6 + 3H_2 \rightarrow W + 6HF \uparrow$$

The characteristic of a tungsten film formed by the CVD method is that the step coverage is excellent compared to the one formed by the sputter method, so that connection hole 6 having a large aspect ratio and a small diameter is completely filled with the tungsten film.

Subsequently, the whole surface of the tungsten film formed by the CVD method is etched back using $SF_6$ or the like to remove the tungsten film and to leave tungsten plug 103 which fills the connection hole. The sectional structure at this time is shown in FIG. 11.

Figure 12:
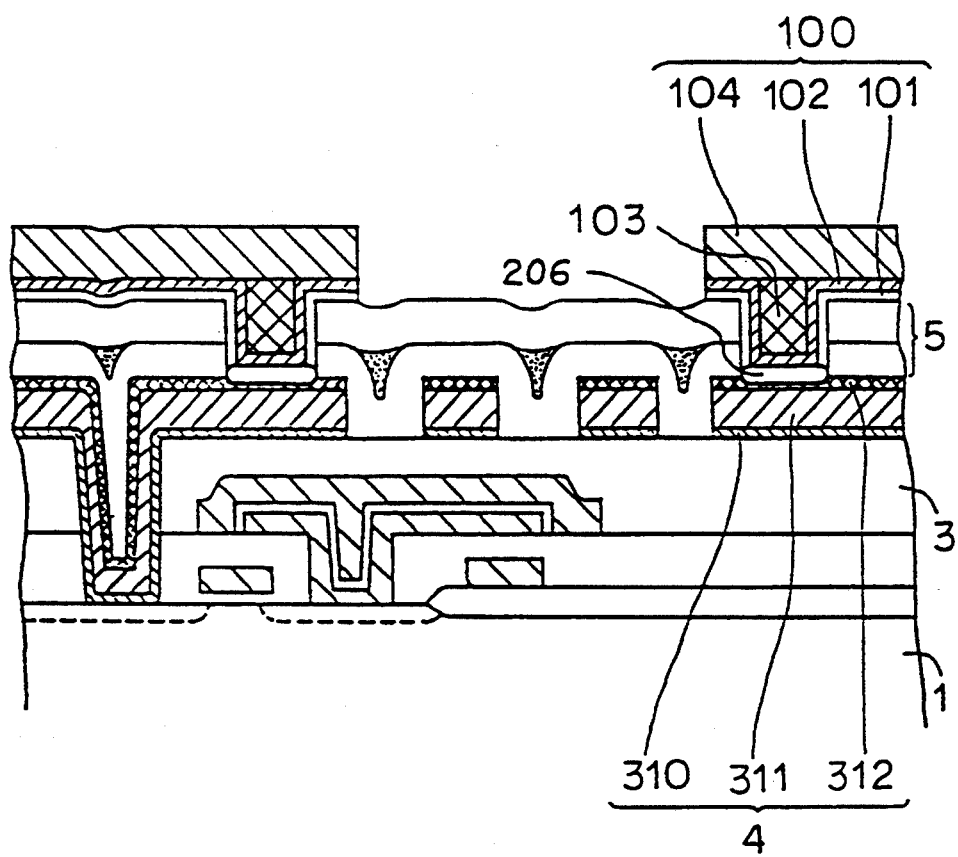

Thereafter, referring to FIG. 12, for the uppermost layer of second aluminum interconnection layer 100, for example, Al-Si-Cu film 104 is successively deposited by the sputter method. Second aluminum interconnection layer 100 having a three-layer structure comprised of titanium film 101, titanium nitride film 102 and aluminum alloy film 104 is patterned using photolithography and etching, as was first aluminum interconnection layer 4.

In order to promote mixing at the interface between first aluminum interconnection layer 4 and second aluminum interconnection layer 100, a heat treatment is carried out at temperatures of 300°–450° C. for about 15–60 minutes, whereby particles 314 of the fluoride and oxide in the tungsten remaining on surface 205 of first aluminum interconnection layer 4 at the via-hole portion are decomposed through an action of titanium film 101. Tungsten film 312 in the surface of first aluminum interconnection layer 4 and titanium film 101 react with each other to form alloy layer 206.

Figure 14A:
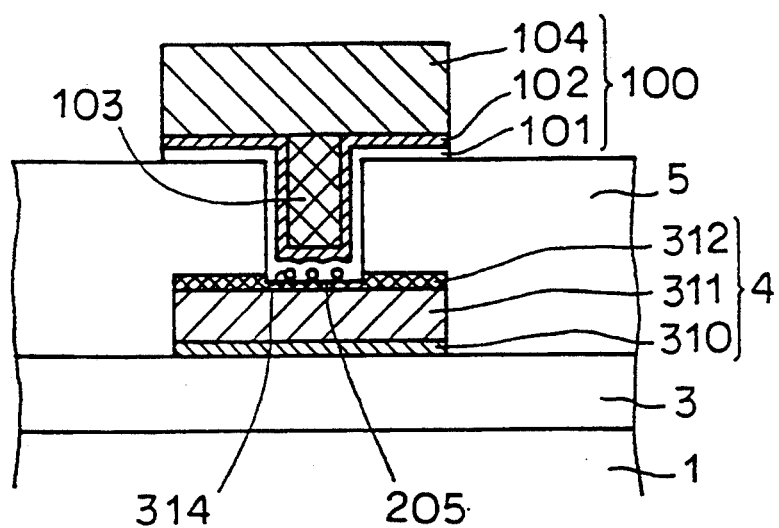
FIGS. 14A and 14B are enlarged partial sectional views showing a connection structure of a first aluminum interconnection layer and a second aluminum interconnection layer for illustrating an operation at an interface therebetween.
Figure 14B:
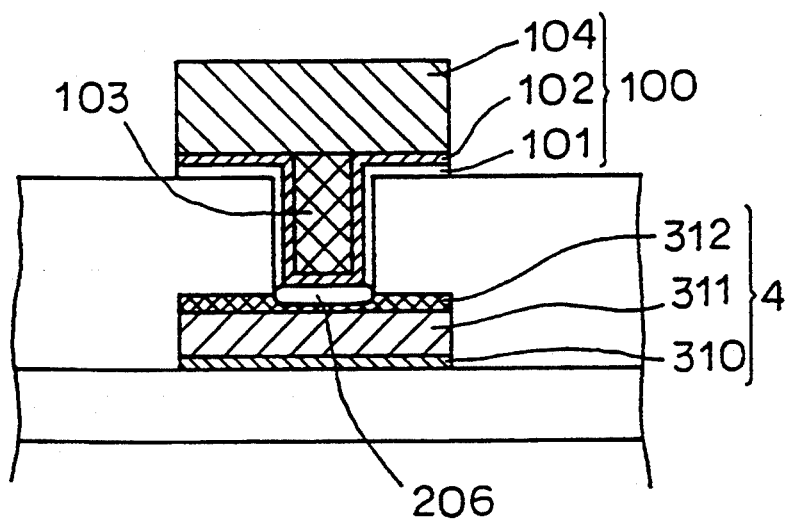

FIGS. 14A and 14B show an enlarged connection structure for illustrating mixing at the interface between first aluminum interconnection layer 4 and second aluminum interconnection layer 100. Referring to FIG. 14A, deterioration particles 314 of tungsten due to the re-sticking of the particles of the fluoride and oxide included in the tungsten in the etching still remain on surface 205 of first aluminum interconnection layer 4 even after the formation of second aluminum interconnection layer 100. Particles 314 prevents mixing at interface 205 between first aluminum interconnection layer 4 and second aluminum interconnection layer 100.

Therefore, as shown in FIG. 14B, after second aluminum interconnection layer 100 is formed, heat treatment at temperatures of 300°–450° C. is carried out for about 15–60 minutes as described above. As a result, deterioration particles 314 of tungsten are captured as oxide and fluoride of titanium and decomposed. This is because titanium film 101 has a strong binding power with fluoride and oxide forming deterioration particles of tungsten and easily forms fluoride and oxide of titanium in heat treatment at 300°–450° C. Furthermore, in the heat treatment, tungsten film 312 in the surface of first aluminum interconnection layer 4 and titanium film 101 react with each other to form alloy layer 206. This promotes mixing at interface 205, resulting in improved adhesion of first aluminum interconnection layer 4 and second aluminum interconnection layer 100.

Figure 13:
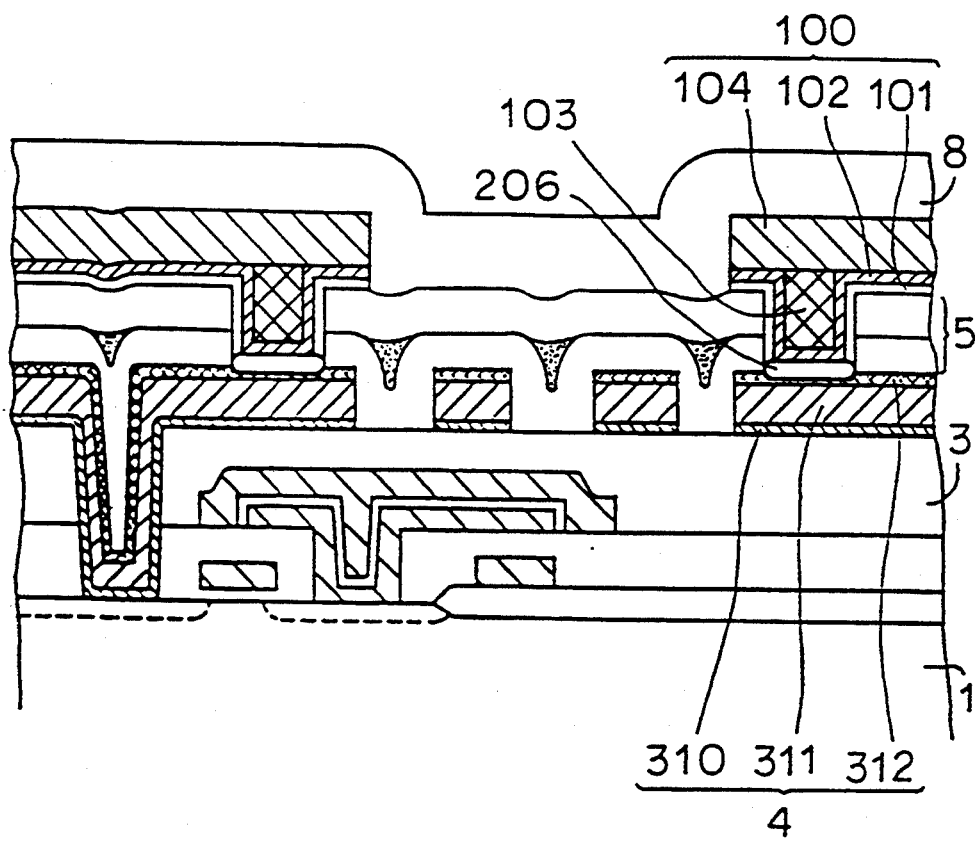

Finally, referring to FIG. 13, in order to protect semiconductor elements and interconnections formed in a semiconductor substrate against moistures and the others entering from the outside, protection insulating film 8 such as a silicon oxide film and a silicon nitride film is deposited using the CVD method on second aluminum interconnection layer 100.

Figure 15A:
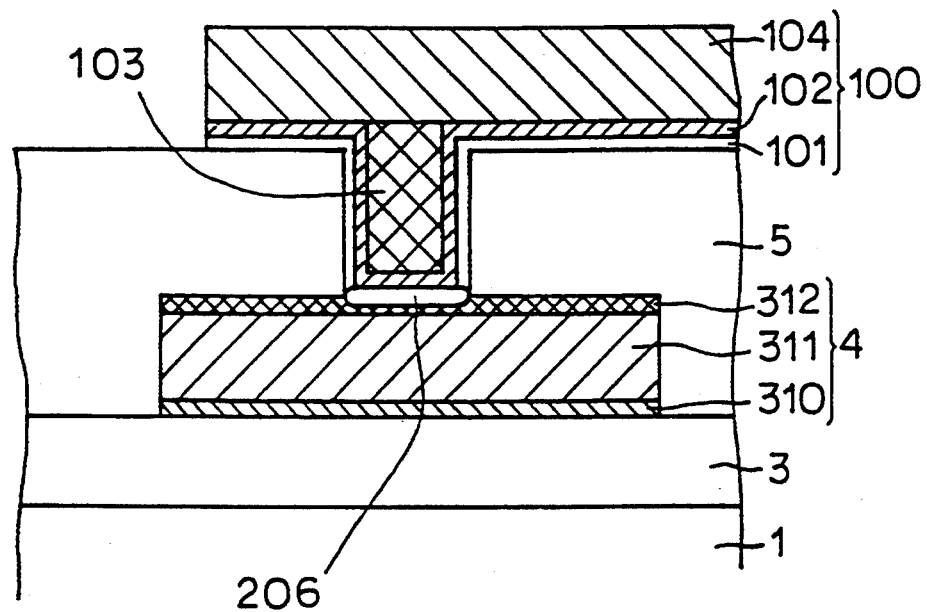
FIGS. 15A and 15B are enlarged partial sectional views showing an interconnection structure for illustrating existence of an optimum value of a titanium film thickness in an interconnection structure of the present invention.
Figure 15B:
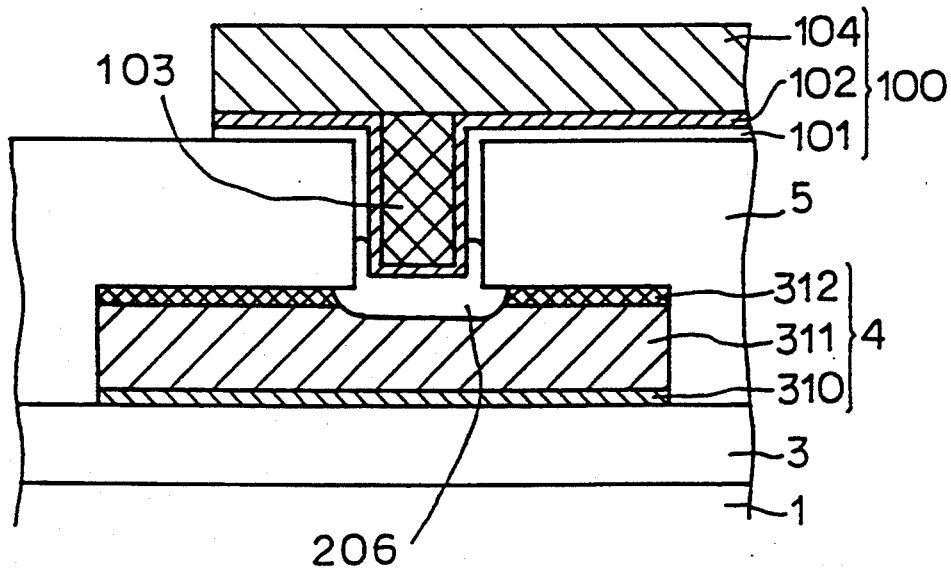

The optimal value exists for a thickness of titanium film 101 used in the interconnection structure of the present invention for the following reasons, which will be described with reference to FIGS. 15A and 15B.

After second aluminum interconnection layer 100 is formed, titanium film 101 reacts with tungsten film 312 in the surface of first aluminum interconnection layer 4 by the heat treatment at 300°–450° C. and forms alloy (alloy of Ti and W) layer 206. FIG. 15A shows a cross section of the interconnection structure when a thickness of titanium film 101 is suitable. As shown in FIG. 15B, if titanium film 101 is too thick, a harmful effect is produced. That is, if alloy layer 206 is excessively formed, the interface between first aluminum interconnection layer 4 and second aluminum interconnection layer 100 becomes fragile because of a stress or the like caused by the reaction, resulting in a problem that a mechanical strength is reduced. Conversely, if titanium film is too thin, mixing at the interface can not be promoted sufficiently. Therefore, both upper and lower limits exist for a thickness of titanium film 101 used in the interconnection structure of the present invention. In the perception of the inventors obtained through the experiment, it is preferable that a thickness of titanium film 101 is in a range of 50 Å to 150 Å.

In the above embodiment, titanium nitride film 102 is provided on titanium film 101 to suppress the reaction of titanium film 101 with aluminum alloy film 103 forming the second aluminum interconnection layer. However, other titanium compound films such as a titanium oxide film or a titanium nitrogen oxide film, which also serve to suppress the interaction of the two films, produce a similar effect. These films can be deposited, as in the above embodiment using the reactive sputter method. That is, sputtering is carried out in an ambient gas for Ar+$O_2$ when the titanium oxide film is deposited, and in an ambient gas for Ar+$O_2$+$N_2$ when the titanium oxynitride film is deposited, using Ti as a target to deposit a desired titanium compound film.

In the above embodiment, the tungsten plug is formed by the CVD method in order to improve coverage of the aluminum alloy film at the connection hole. However, metal plugs, other than the tungsten plug, such as tungsten silicide and molybdenum formed by other metal CVD methods produce a similar effect.

Furthermore, in the above embodiment, the surface of the lower first aluminum interconnection layer is formed of a tungsten film. However, even if the surface film of the first aluminum interconnection layer is another refractory metal film such as a titanium-tungsten (Ti - W) film, a refractory metal compound film such as a titanium nitride (TIN) film, a refractory metal silicide film such as a molybdenum-silicide ($MoSi_2$) and a tungsten-silicide ($WSi_2$) film, or an amorphous-silicon film, a similar effect can be obtained.

Although a two-layer interconnection structure of aluminum is described in the above embodiment, a similar effect is obtained when the present invention is applied to a semiconductor integrated circuit device having a multi-layer, that is, more than two layers, interconnection structure of aluminum.

Furthermore, although the present invention is applied to the semiconductor integrated circuit device where a DRAM cell is formed on the surface of the semiconductor substrate, a similar effect is produced also by applying the present invention to a semiconductor integrated circuit device where other elements are formed.

Figure 16:
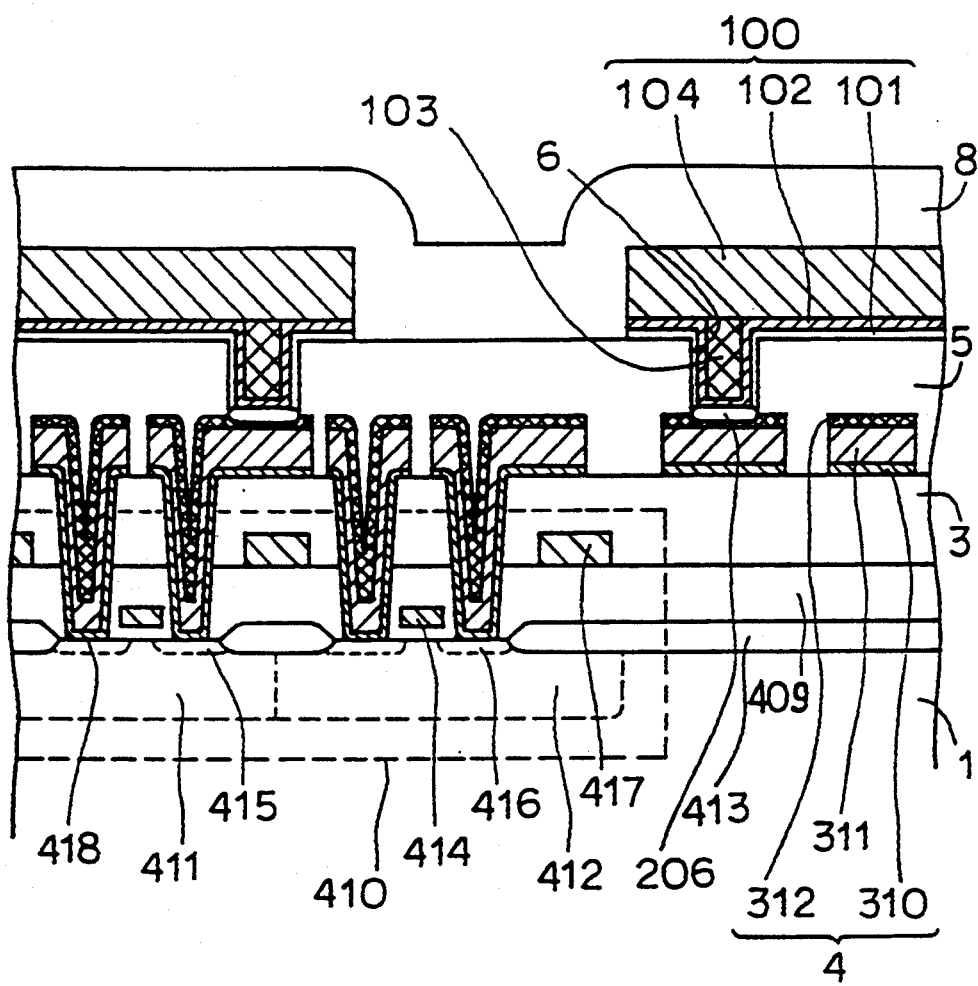
FIG. 16 is a partial sectional view showing an interconnection structure of a semiconductor integrated circuit device according to another embodiment of the present invention.
Figure 17:
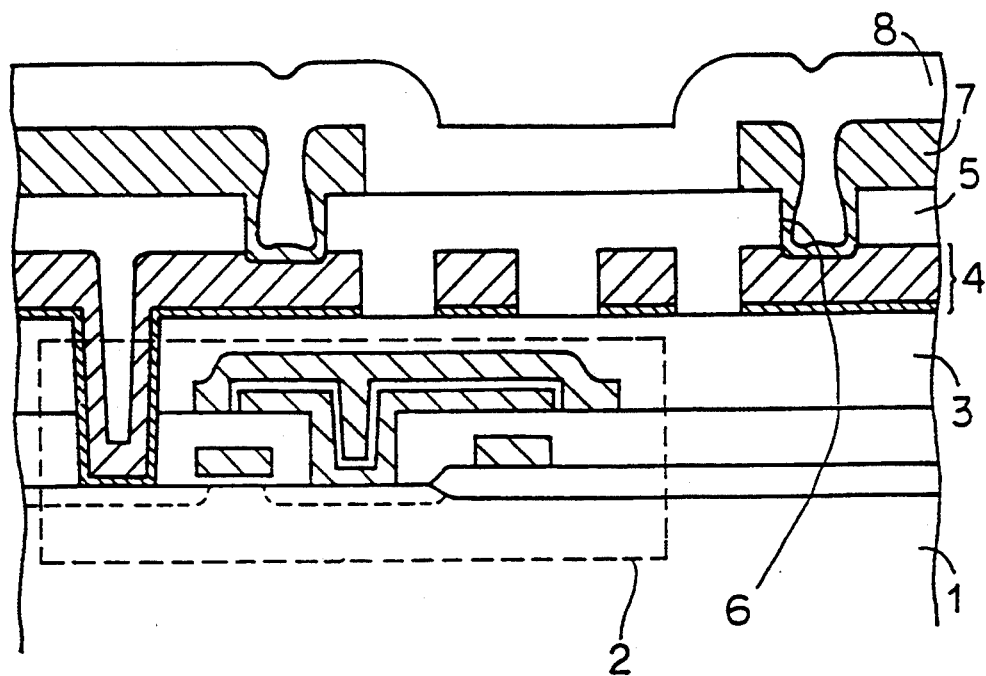
FIG. 17 is a partial sectional view showing an interconnection structure of a conventional semiconductor integrated circuit device.
Figure 18:
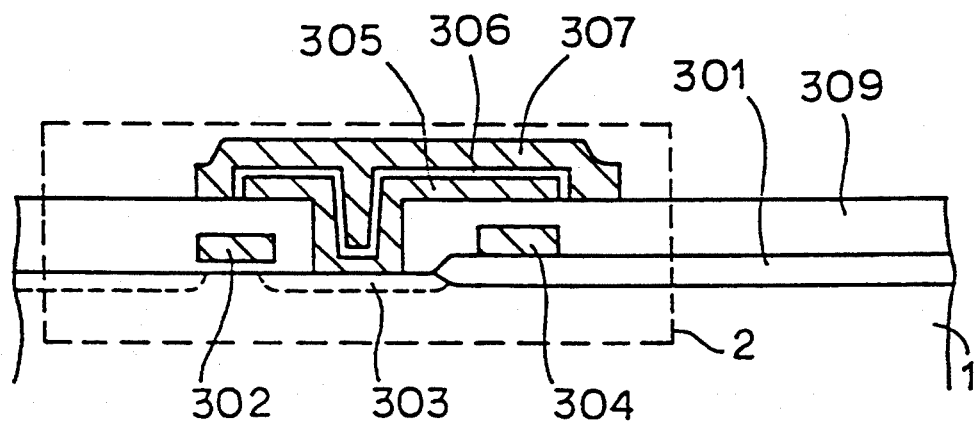
FIGS. 18 through 24 are partial sectional views showing respective steps of a formation method of the interconnection structure of the conventional semiconductor integrated circuit device shown in FIG. 17.
Figure 19:
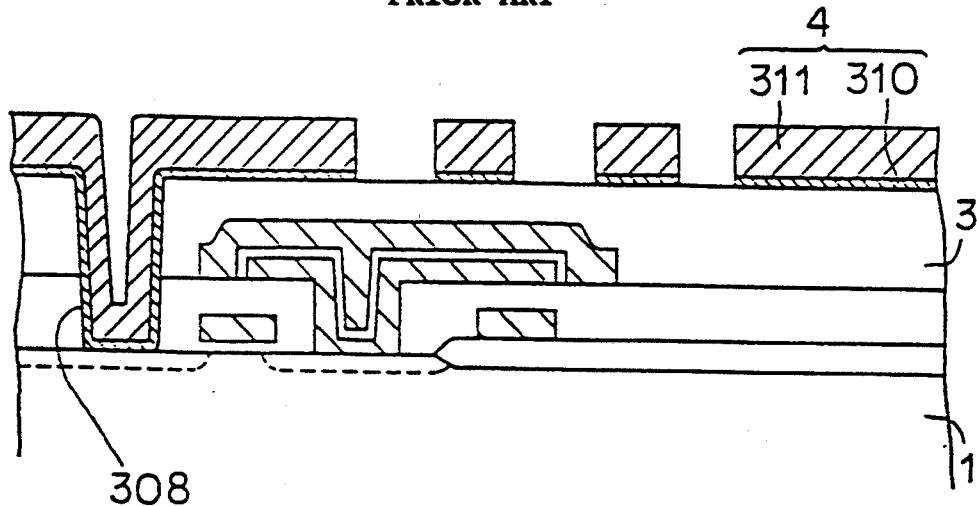
Figure 20:
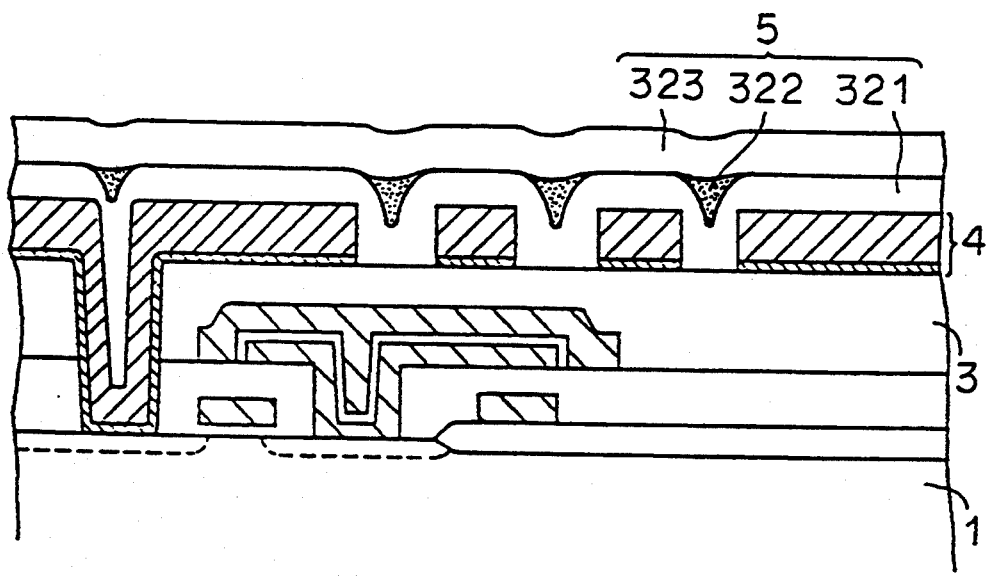
Figure 21:
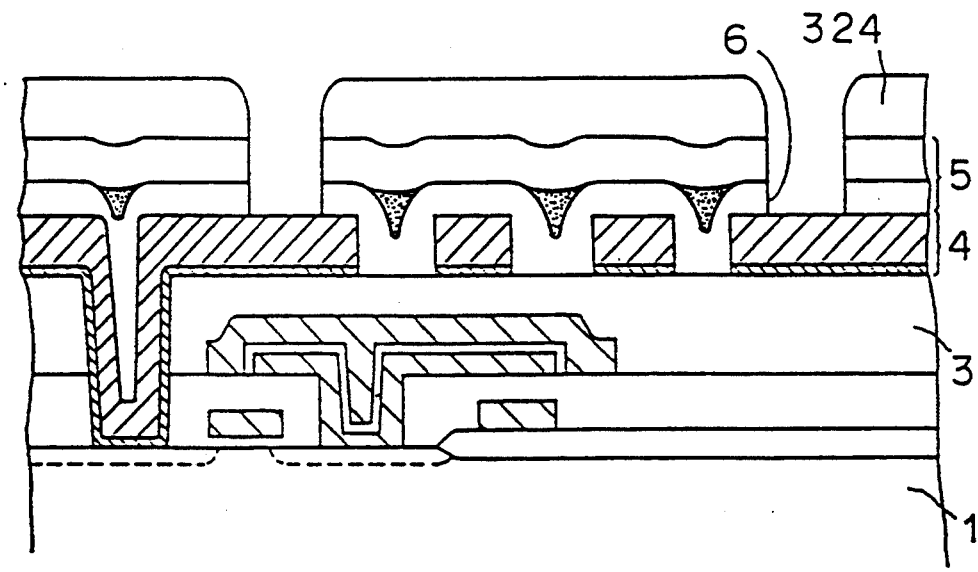
Figure 22:
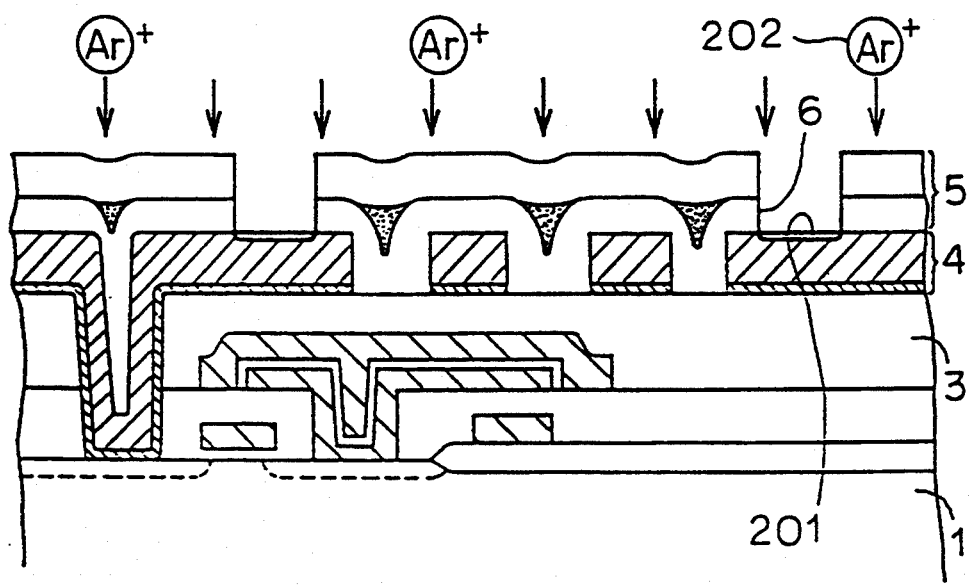
Figure 23:
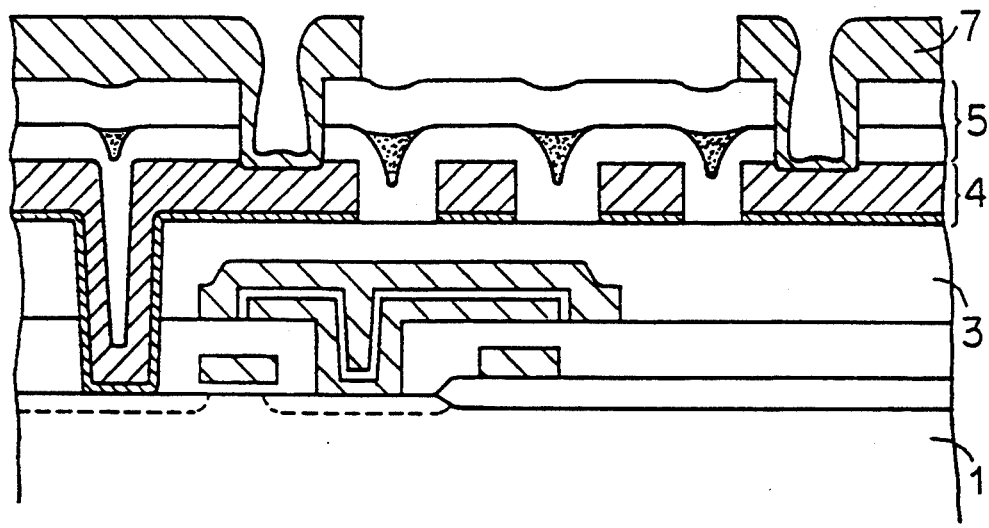
Figure 24:
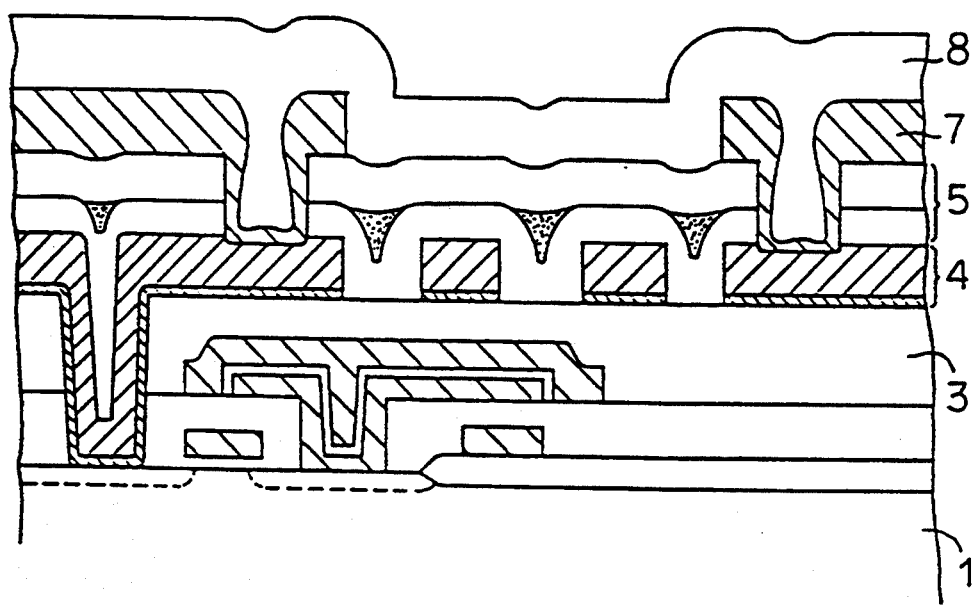
Figure 25A:
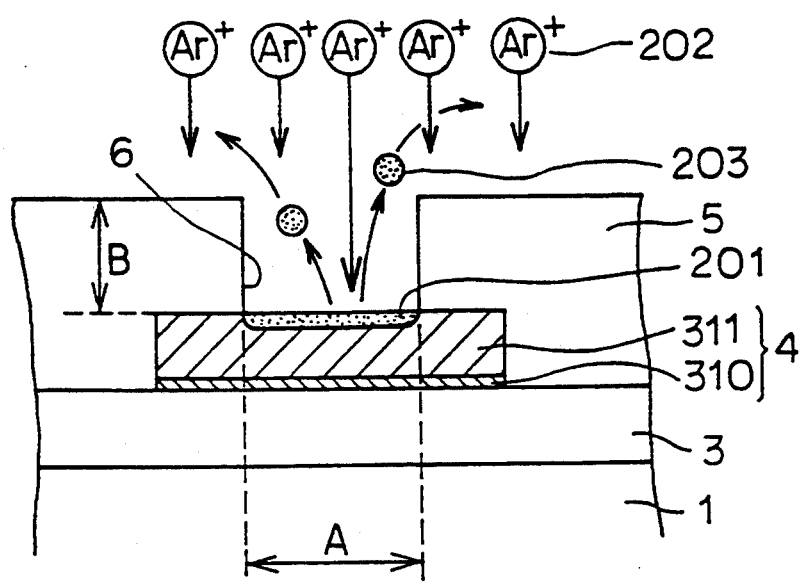
FIGS. 25A and 25B are partial sectional views showing the situation when sputter-etching is carried out in the formation step of the conventional interconnection structure.
Figure 25B:
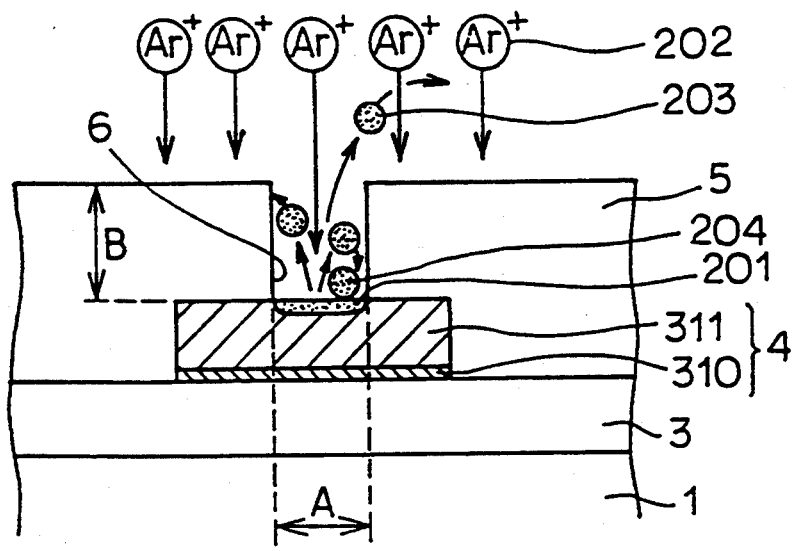
Figure 26A:
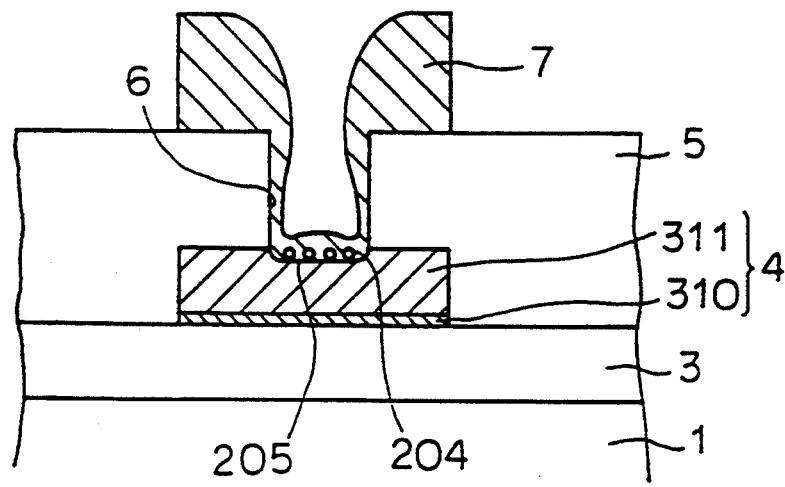
FIG. 26A is an enlarged partial sectional view showing the conventional interconnection structure.
Figure 26B:
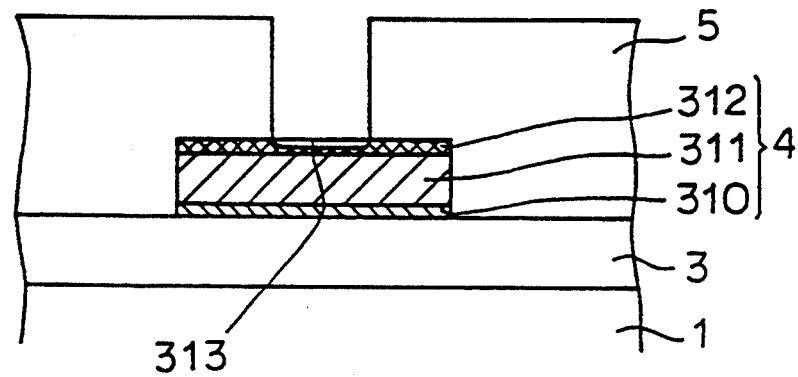
FIGS. 26B and 26C are partial sectional views showing the situation when sputter-etching is carried out in the formation step of an improved conventional interconnection structure.
Figure 26C:
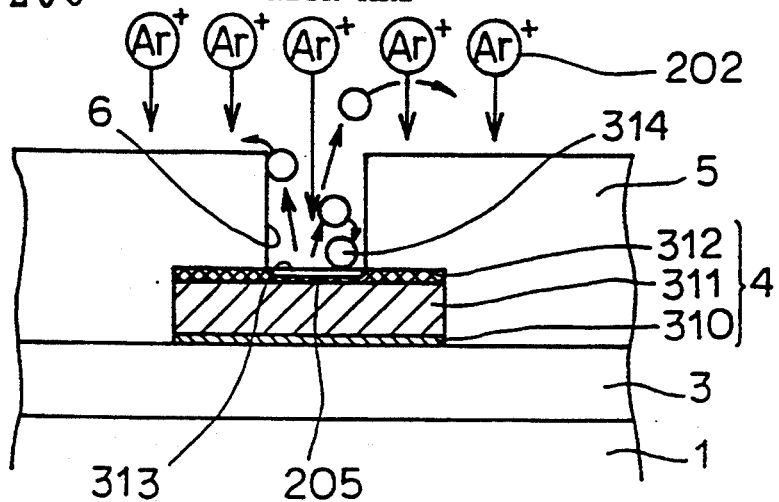

FIG. 16 shows an embodiment in which a multi-layer interconnection structure of aluminum according to the present invention is applied to a semiconductor integrated circuit device where an SRAM (Static Random Access Memory) cell is formed on the surface of a semiconductor substrate. A detailed description of the structure of the semiconductor integrated circuit device having an SRAM cell will not be given, and only the main structure will be described.

Referring to FIG. 16, an SRAM cell 410 having a double well-CMOS (Complementary Metal Oxide Semiconductor) is formed on a surface of a silicon semiconductor substrate 1. A p type well region 411 and an n type well region 412 adjacent to each other are formed in silicon semiconductor substrate 1. For-electrically isolating these well regions 411 and 412 from each other, element separate oxide films 413 are formed with spaces therebetween on silicon semiconductor substrate 1. N type impurity diffusion layers 415 are formed in p type well region 411 to be spaced apart from each other, and a gate electrode 414 is formed therebetween. In n type well region 412, p type impurity diffusion layers 416 are formed to be spaced apart from each other, and a gate electrode 414 is formed therebetween. An insulating film 409 is formed to cover gate electrode 414. Polycrystalline silicon interconnection layers 417 are formed with spaces therebetween on insulating film 409. A base insulating film 3 is deposited on SRAM cell 410. A contact hole 418 reaching surfaces of n type impurity diffusion layer 415 or p type impurity diffusion layer 416 is formed in base insulating film 3 and insulating film 409. A first aluminum interconnection layer 4 is formed on a base insulating film 3 to be in contact with impurity diffusion layer 415 or 416 through contact hole 418. The connection structure of first aluminum interconnection layer 4 and second aluminum interconnection layer 100 is the same as that shown in FIG. 1.

Similarly, elements formed on the surface of silicon semiconductor substrate 1 may be other elements than a DRAM cell and an SRAM cell having other structures, such as an EPROM (Erasable Programmable Read Only Memory) cell, an $E^2$PROM (Electrical Erasable Programmable ROM) cell, a micro-computer circuit element, a CMOS logic circuit element, a bipolar-transistor element.

As described above, according to the present invention, by employing a stacked-layer film comprised of a titanium layer and a titanium compound layer as a base layer for the upper aluminum interconnection layer adjacent to the lower aluminum interconnection layer through a connection hole, a stable contact can be made at a connection hole of a multi-layer aluminum interconnection structure. And also, coverage of the upper aluminum interconnection layer in a connection hole is improved by using a metal-containing layer filling the connection hole, so that a electrical contact resistance is stabilized and the reliability of a semiconductor integrated circuit device is improved in the connection hole such as resistance against electro-migration and stress-migration.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A manufacturing method of an interconnection structure of a semiconductor device, comprising the steps of
    forming a first aluminum-containing layer on a main surface of a semiconductor substrate;
    forming a tungsten layer on said first aluminum-containing layer;
    forming an insulating layer on said tungsten layer;
    forming a through-hole through which a surface of said tungsten layer is exposed by selectively removing said insulating layer;
    forming a titanium layer on said insulating layer to be in contact with the surface of said tungsten layer through said through-hole;
    forming a titanium compound layer on said titanium layer;
    selectively forming a metal-containing layer filling said through-hole on said titanium compound layer; and
    forming a second aluminum-containing layer on said metal-containing layer and said titanium compound layer.

2. The manufacturing method of an interconnection structure of a semiconductor device according to claim 1, wherein said step of forming a through-hole comprises the step of sputter-etching the surface of said tungsten layer with argon ion.

3. The manufacturing method of an interconnection structure of a semiconductor device according to claim 2, further comprising the step of causing reaction of said tungsten layer and said titanium layer by applying thermal process.

4. The manufacturing method of an interconnection structure of a semiconductor device according to claim 3, wherein said step of applying thermal process comprises the step of heating at a temperature of 300°–450° C. for 15–60 minutes.

5. The manufacturing method of an interconnection structure of a semiconductor device according to claim 1, wherein the tungsten layer is formed by sputtering.

6. The manufacturing method of an interconnection structure of a semiconductor device according to claim 1, wherein the tungsten layer is formed only on the top surface of the first aluminum-containing layer and is not formed on the sidewalls of the first aluminum-containing layer.

* * * * *